United States Patent [19]

Suzuki et al.

[11] Patent Number: 4,592,021

[45] Date of Patent: May 27, 1986

[54] DATA READOUT CIRCUIT FOR AN MOS TRANSISTOR ARRAY

[75] Inventors: Hiroaki Suzuki, Yokohama; Itsuo Sasaki, Kawasaki, both of Japan

[73] Assignee: Shibaura Kenki Kabushiki Kaisha, Japan

[21] Appl. No.: 518,348

[22] Filed: Jul. 29, 1983

[30] Foreign Application Priority Data

Aug. 31, 1982 [JP] Japan ................ 57-150902

[51] Int. Cl.$^4$ ........................................ G11C 7/00
[52] U.S. Cl. ................................ 365/189; 365/203; 365/104
[58] Field of Search ............ 365/189, 203, 94, 103, 365/104

[56] References Cited

U.S. PATENT DOCUMENTS

| | | | |
|---|---|---|---|
| 4,204,277 | 5/1980 | Kinoshita | 365/203 |
| 4,318,014 | 3/1982 | McAlister et al. | 365/104 X |
| 4,447,893 | 5/1984 | Murakami | 365/203 |

*Primary Examiner*—Joseph A. Popek
*Attorney, Agent, or Firm*—Finnegan, Henderson, Farabow, Garrett & Dunner

[57] ABSTRACT

A data readout circuit for an MOS transistor array includes a plurality of data output lines. To each of the data output lines are connected N-channel MOS transistors of a corresponding row group. Each of P-channel data output line selection MOS transistors is connected between each of the data output lines and a data output node. An access time is shortened by controlling the data output line selection MOS transistors to be conductive while the data output lines and the data output node are both in a precharged state.

4 Claims, 7 Drawing Figures

DATA READOUT CIRCUIT FOR AN MOS TRANSISTOR ARRAY

BACKGROUND OF THE INVENTION

This invention relates to a data readout circuit for an MOS transistor array which effects the reading of data stored in a read only memory (ROM) or output data from a decoder.

Description will now be given with reference to FIG. 1 of the conventional circuit for reading data stored in a ROM. Referring to FIG. 1, an MOS transistor array 1 comprises a plurality of N-channel MOS transistors Trn arranged in matrix form and data output lines B1 to B4. Connected between each of the data output lines B1 to B4 and each of discharge lines 2 are the source-drain paths of MOS transistors of a corresponding row group. Connected between a power source $V_{DD}$ and one end of each of the data output lines B1, B2, B3, B4 is a source-drain path of one of precharge P-channel MOS transistors Trp1, Trp2, Trp3 and Trp4. A clock signal $\phi$ is supplied to the gate electrodes of the MOS transistors Trp1 to Trp4, and a clock signal $\overline{\phi}$ is delivered to the discharge lines 2. Each of the output lines of a column decoder 3, namely, each of the selection signal input lines C11, C12, ..., C1(n−1), C1n for the MOS transistor array 1 is connected to the gate electrodes of the MOS transistors of a corresponding column group. In some cases, at least one of the MOS transistors corresponding to a column group is omitted as shown in FIG. 1.

Connected between a data output node W1 and each of the data output lines B1 to B4 is the source-drain path of one of N-channel MOS transistors Tn1 to Tn4. The data output line selection MOS transistors are intended to selectively connect the data output lines B1 to B4 to the data output node W1. The gate electrodes of the data output line selection MOS transistors Tn1 to Tn4 are connected to the output lines of a row decoder 4, that is, the driving lines R1 to R4 for the selection MOS transistors. The source-drain path of a precharge P channel MOS transistor Trp0 is connected at one end to the data output node W1, and at the other end to the power source $V_{DD}$. A clock pulse $\phi$ is supplied to the gate electrode of the P-channel MOS transistor Trp0. One input terminal of a differential sense amplifier 5 is connected to the data output node W1, and the other input terminal of the amplifier 5 is supplied with a reference voltage $V_B$ from a reference voltage generator 6. Data Da is produced from the sense amplifier in accordance with a prescribed input condition.

Description will now be given of the operation of the conventional data read-out circuit. Reference will also made to problems which should be resolved. Referring to FIG. 1, when a clock signal $\phi$ has a low level L, the MOS transistors Trp0 to Trp4 are rendered conductive, causing the data output node W1 and the data output lines B1 to B4 to be precharged to a high level H ($V_{DD}$ level). Later, when the clock signal $\phi$ changes to H level, the MOS transistors Trp0 to Trp4 are rendered nonconductive. As a result, the data output node W1 and data output lines B1 to B4 commence discharge through the discharge lines 2. Now let it be assumed that input address signals (not shown) to the column decoder 3 cause only the selection signal input line C11 or the output lines of the column decoder 3 to have a high level H, and only the driving line R1 or the output lines of the row decoder 4 to have a high level H. FIG. 2 shows a discharge pattern under the above-mentioned assumption. The abscissa shows time t, and the ordinate indicates the voltage level $V_{DD}$ of the power source, the level of the reference voltage $V_B$ and ground level GND.

Referring to FIG. 2, when a clock pulse $\phi$ has a high level H at time P, the discharge line 2 has a low level L. Consequently, the data output line B1 immediately commences discharge. The potential of the data output line B1 gradually falls from the high level of $V_{DD}$ to the low ground level GND (refer to line B1). The charge of the data output node W1 begins to be released at time Q when the MOS transistor Tn1 is rendered conductive. The potential of the node W1 falls to the ground level GND as indicated by line W1. When the potential of the data output node W1 reaches the reference voltage level $V_B$, the level of the data Da changes from ground level GND to high level $V_{DD}$. Now let it be assumed that $t_m$ denotes a period of time between time P and time Q. This time period $t_m$ corresponds to a period during which a difference between the potential level on line B1 and the $V_{DD}$ level is made equal to the threshold voltage $V_{thn}$ of the MOS transistor Tn1. The reason why the period $t_m$ is not reduced to zero is explained below.

Referring to FIG. 1, when the data output node W1 and data output lines B1 to B4 are in a precharged state, then the source voltage and drain voltage of the respective data output line selection MOS transistors Tn1 to Tn4 have a high level. Since the MOS transistors Tn1 to Tn4 are N-channel, these MOS transistors are all rendered nonconductive in this state. Even when the output line C11 of the column decoder 3 has a high level, and the charge of the data output line B1 is released at time P, the selection MOS transistor Tn1 for the data output line B1 still remains nonconductive as previously described, thereby preventing the charge of the data output node W1 from being released at time P. At time Q, when the potential of the data output line B1 gradually falls, causing the difference between the $V_{DD}$ level and the potential level of the data output line B1 to be made equal to the threshold voltage $V_{thn}$ of the MOS transistor Tn1 (including the back gate effect), the data output node W1 begins to be discharged. In this case, there is the drawback that the access time $t_{ac}$ is lengthened. The access time $t_{ac}$ is defined as a time length between time P at which the data output line B1 is selected and the time when the data Da is produced from the sense amplifier 5.

SUMMARY OF THE INVENTION

It is accordingly the object of this invention to provide a data readout circuit for an MOS transistor array which shortens an access time required to read out data from an MOS transistor array constituting a ROM or a decoder.

To attain the above-mentioned object, this invention provides a data readout circuit which comprises: an MOS transistor array constructed by arranging a plurality of MOS transistors in matrix form; a plurality of data output lines, to each of which MOS transistors of a corresponding row group are connected; a plurality of selection signal input lines, to each of which the gate electrodes of MOS transistors of a corresponding column group are connected; a data output node; a plurality of data output line selection MOS transistors for effecting selective connections between the data output lines and the data output node; a plurality of driving lines for selectively driving the data output line selection MOS transistors; means for precharging and discharging the data output lines and the data output node in accordance with the potential levels of control signals; and means for obtaining readout data in accordance with the potential level on the data output node; the data output line selection MOS transistors being chosen to have a conductivity mode different from that of the MOS transistors constituting the MOS transistor array, so that the data output line selection MOS transistors are rendered conductive while both the data output node and the data output lines are in a precharged state.

DETAILED DESCRIPTION OF THE PREFERRED EMBODIMENTS

Figure 1:
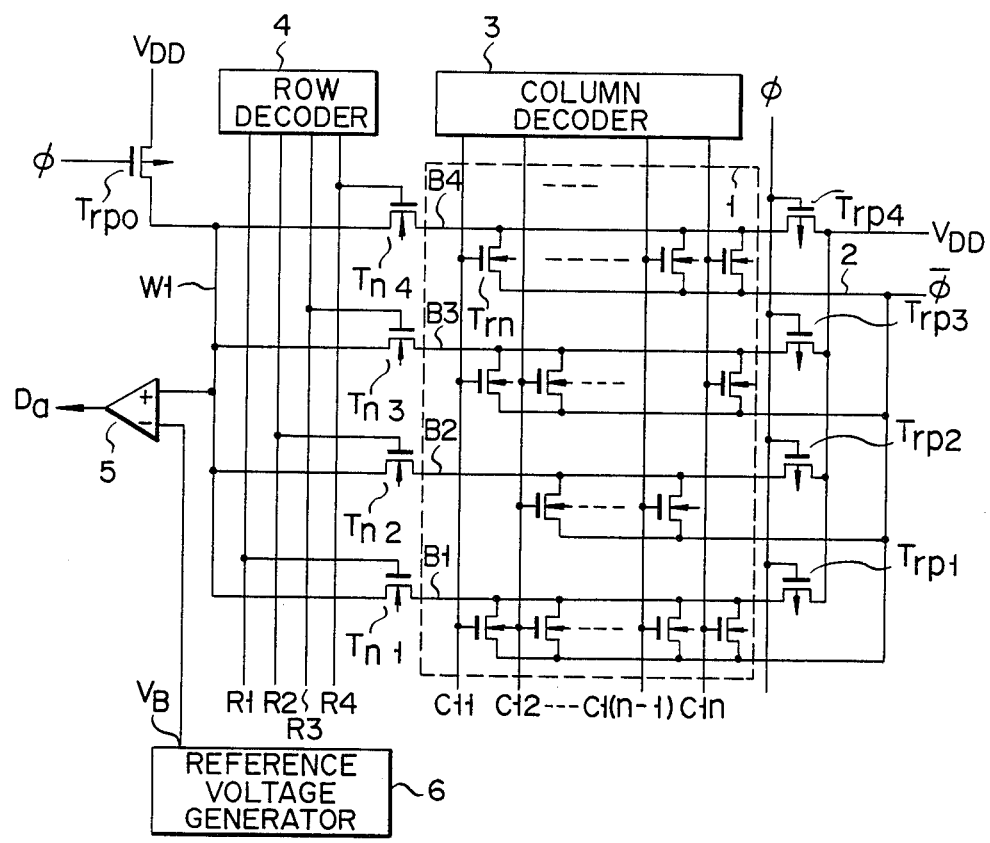
FIG. 1 is a block diagram of a conventional data readout circuit for reading data out of a read only memory (ROM)
Figure 3:
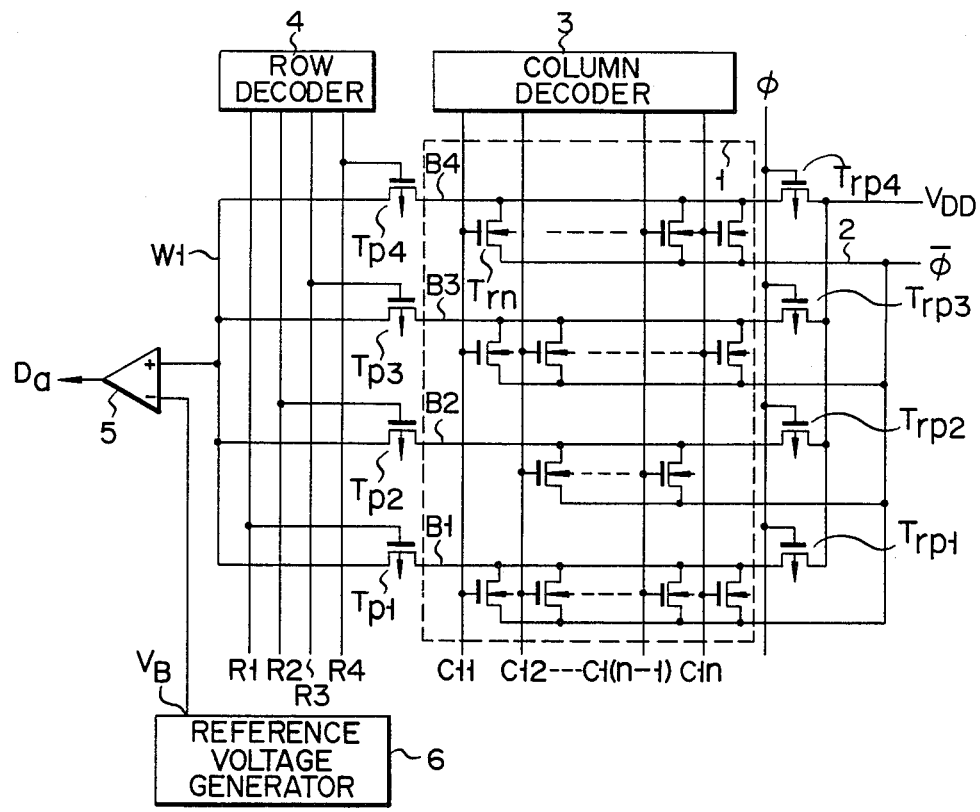
FIG. 3 is a block diagram of a data readout circuit according to a first embodiment of this invention.

FIG. 3 shows the circuit arrangement of a data readout circuit according to a first embodiment of this invention which corresponds to the conventional type of FIG. 1. The parts of FIG. 3 which are the same as those of FIG. 1 are denoted by the same numerals, the description thereof being omitted. In FIG. 1, the output line selection MOS transistors Tn1 to Tn4 are of the N-channel type, whereas the corresponding output line selection MOS transistors Tp1 to Tp4 of FIG. 3 are of the P-channel type. In FIG. 1, a precharge MOS transistor Trp0 is connected to the data output node W1, but in FIG. 3 such a precharge MOS transistor is omitted.

Among the output lines of the row decoder 4 of FIG. 3, that is, the driving lines R1 to R4 for driving the data output line selection transistors Tp1 to Tp4, only one line selected by the row decoder 4, for example, R1 is chosen to have a low level L. Only the selection MOS transistor, for example, Tp1 whose gate electrode is connected to the selection line R1 is rendered conductive. Conversely, the other selection lines R2 to R4 are set at a high level H, causing the other selection MOS transistors Tp2 to Tp4 to be rendered nonconductive. In this case, therefore, the data output line B1 alone is connected to the data output node W1.

When a clock signal $\phi$ has a low level L (ground level GND), the precharge MOS transistors Trp1 to Trp4 are rendered conductive, causing the data output lines B1 to B4 to be precharged to a high level ($V_{DD}$ level). Since, in this case, at least one of the selection MOS transistors Tp1 to Tp4 is rendered conductive, the data output node W1 is also precharged to a high level. When a clock signal $\phi$ is set at a high level, the precharge MOS transistors Trp1 to Trp4 are rendered nonconductive. At this time, a potential having a ground level GND is supplied to the sources of the MOS transistor Trn constituting the MOS transistor array.

When only the output line C11 of the column decoder 3 is selectively set at a high level, the charge on the data output lines B1, B3 and B4 is released through the transistors Trn whose gate electrodes are connected to the output line C11 of the column decoder. The data output line B2 is not connected to the MOS transistor Trn whose gate electrode is connected to the output line C11 of the column decoder 3, thereby preventing the charge of the data output line B2 from being released. When the driving line R1 of the row decoder 4 is selectively set at a low level, the P-channel selection MOS transistor Tp1 is rendered conductive with its source and drain regions precharged at a high level. Therefore, the data output node W1 and the data output line B1 are electrically connected in a precharged state. The circuit of FIG. 3 is thus operated at a timing illustrated in FIG. 4.

Figure 2:
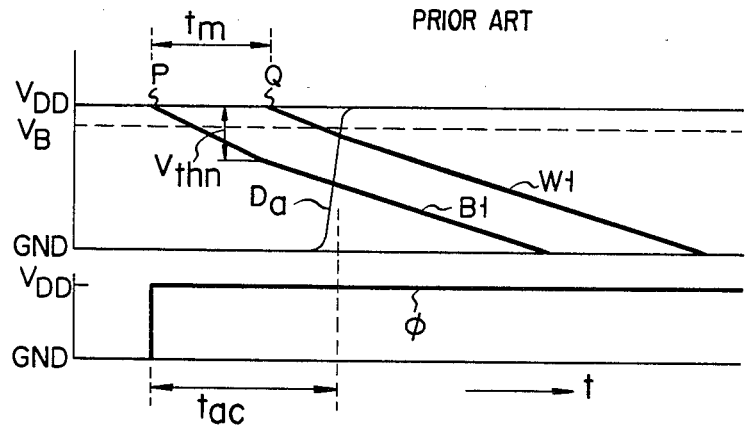
FIG. 2 is a timing chart illustrating the operation of the conventional data readout circuit of FIG. 1.
Figure 4:
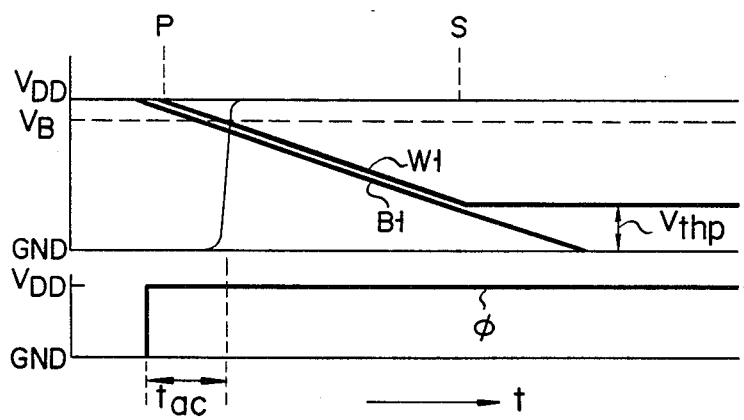
FIG. 4 is a timing chart illustrating the operation of the data readout circuit of FIG. 3.

When the clock signal $\phi$ has its level changed from L level to H level, and the output line C11 and the driving line R1 are selected, then the data output line B1 and the data output node W1 begin to be simultaneously discharged at time P. The potentials on the lines B1 and W1 have their levels gradually reduced along lines B1 and W1 as shown in FIG. 4. When the potential level of the data output node W1 falls below that of the reference voltage $V_B$, an output or readout data Da from the differential sense amplifier 5 has its level raised from the GND level to the $V_{DD}$ level. When, in this case, a difference between the potential level on the data output node W1 and GND level is made equal to the threshold voltage $V_{thP}$ of the selection MOS transistor Tp1 at time S, the selection MOS transistor Tp1 is rendered nonconductive. Although the line W1 maintains the $V_{thP}$ level, the data output line B1 has its level reduced to the GND level. Even when the potential level on the line W1 does not fall to the GND level, no difficulties arise, because the reading operation of data Da has already been brought to an end. Obviously the access time $t_{ac}$ shown in FIG. 4 is far shorter than that shown in FIG. 2.

Figure 5:
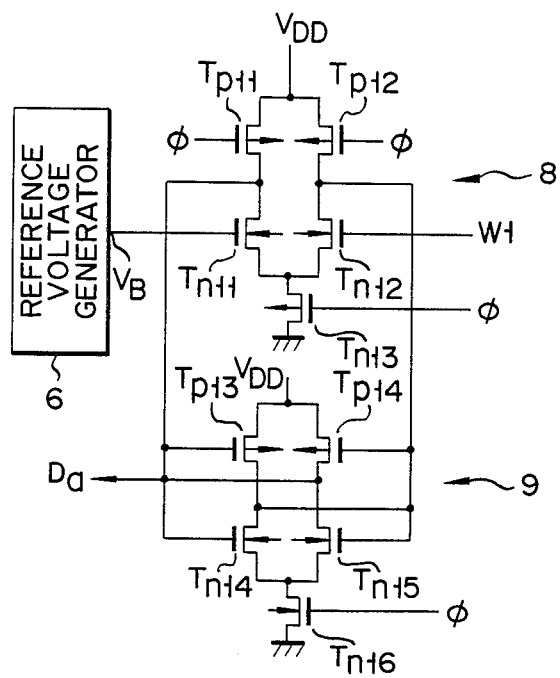
FIG. 5 shows the arrangement of a differential sense amplifier included in FIG. 3.
Figure 7:
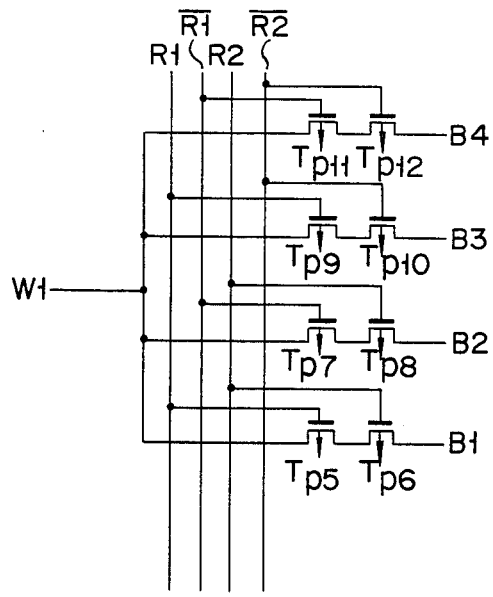
FIG. 7 is a circuit diagram indicating a modification of means for effecting connection between the data output line selection MOS transistors and the driving lines driving the selection MOS transistors.

FIG. 5 shows the circuit arrangement of the differential sense amplifier 5 of FIG. 3. This sense amplifier 5 involves a differential sense amplifier section 8 and data output section 9. The differential sense amplifier section 8 comprises a P-channel MOS transistor Tn13 whose source-drain path is chosen to have the GND level at one end, and whose gate is supplied with a clock signal $\phi$; an N-channel MOS transistor Tn11 and P-channel MOS transistor Tp11 whose source-drain paths are connected in series between the other end of the source-drain path of the transistor Tn13 and power source $V_{DD}$; and an N-channel MOS transistor Tn12 and P-channel MOS transistor Tp12 whose source-drain paths are connected in series between the other end of the source-drain path of the MOS transistor Tn13 and the power source $V_{DD}$. The gate electrodes of the MOS transistors Tp11 and Tp12 are supplied with a clock signal $\phi$. The gate electrode of the MOS transistor Tn12 is connected to the data output node W1. The gate electrode of the MOS transistor Tn11 is supplied with reference voltage $V_B$.

The data output section 9 comprises: an N-channel MOS transistor Tn16, whose source-drain path is held at the GND level at one end, and whose gate electrode is supplied with a clock signal $\phi$; an N-channel MOS transistor Tn14 and P-channel MOS transistor Tp13 whose source-drain paths are connected in series between the power source $V_{DD}$ and the other end of the source-drain path of the MOS transistor Tn16; and an N-channel MOS transistor Tn15 and P-channel MOS transistor Tp14 whose source-drain paths are similarly connected in series between the power source $V_{DD}$ and the other end of the source-drain path of the MOS transistor Tn16. The gate electrodes of the transistors Tp13 and Tn14 are connected to the connection node of the source-drain paths of the MOS transistors Tn11 and Tp11. The gate electrodes of the transistors Tp14 and Tn15 are connected to the connection node of the source-drain paths of the MOS transistors Tp12 and Tn12. The connection node of the source-drain paths of the MOS transistors Tp13 and Tn14 is connected to the gate electrode of the MOS transistor Tn15. The gate electrode of the MOS transistor Tn14 is connected to the connection node of the source-drain paths of the MOS transistors Tp14 and Tn15. Data Da is read out of the connection node between the MOS transistors Tp14 and Tn15. The reference voltage $V_B$ is preferred to have a level approximating the $V_{DD}$ level.

Figure 6:
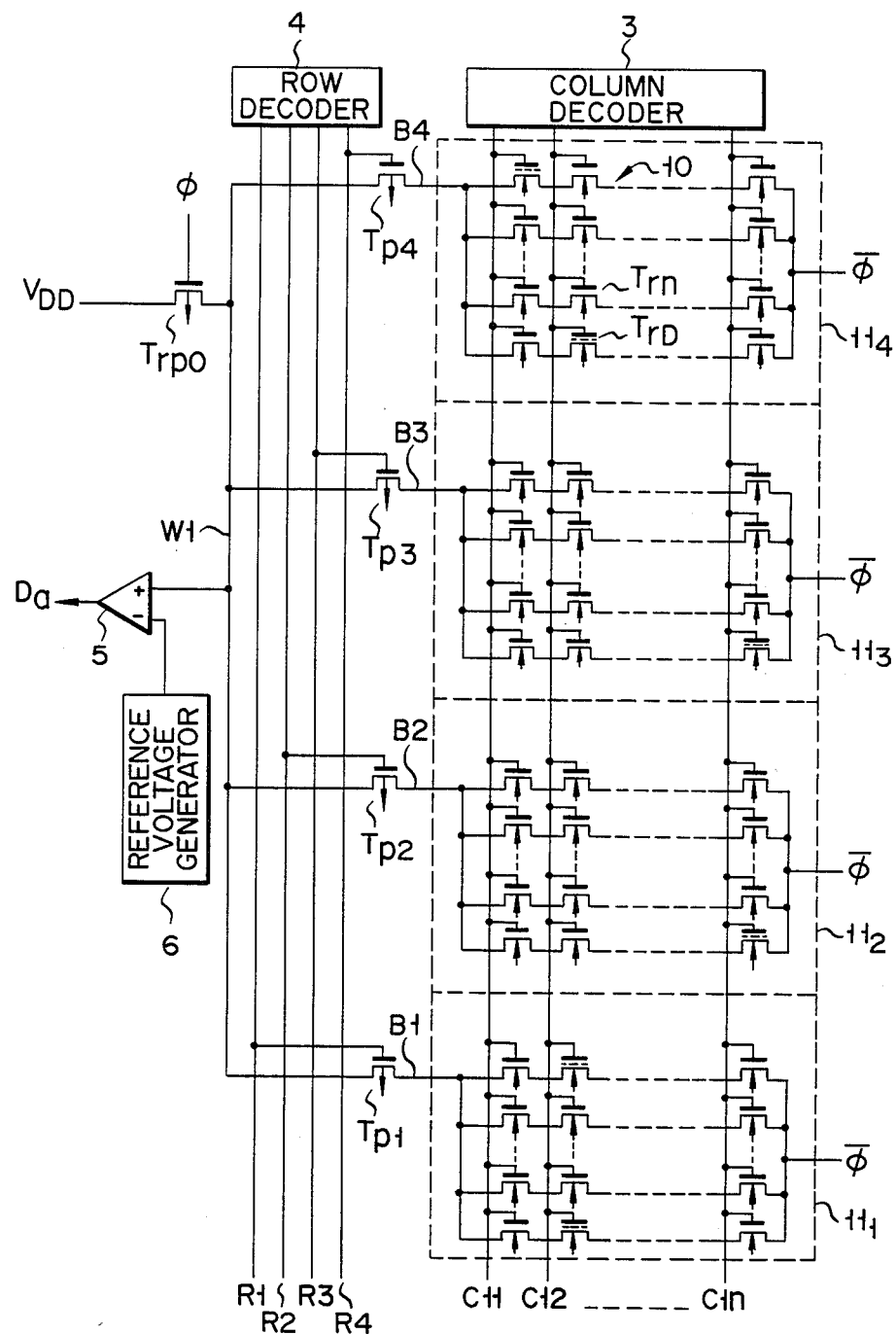
FIG. 6 is a block diagram of a data readout circuit according to a second embodiment of the invention.

Description will now be given with reference to FIG. 6 of a data readout circuit according to a second embodiment of this invention. This second embodiment is different from the first embodiment of FIG. 3 in that the MOS transistor array is formed of MOS transistors arranged in a different manner from FIG. 3; and a precharge MOS transistor Trp0 is connected to the data output node W1. In FIG. 6, each of the data output lines B1, B2, B3 and B4 is connected to a corresponding one of array subunits $11_1$, $11_2$, $11_3$ and $11_4$. The respective subunit is constructed by connecting in parallel a plurality of series arrangements 10, each of which consists of a plurality of N-channel MOS transistors connected in series in the row direction. The gate electrodes of the MOS transistors constituting one respective arrangement 10 are connected to the corresponding output lines C11, C12, ..., C1n of the column decoder 3. Each array subunit includes at least one depletion mode MOS transistor TrD, and is supplied at one end with a clock signal $\phi$. Whether each array subunit is made to store data "1" or data "0" is determined in accordance with the manner in which the enhancement MOS transistor Trn and depletion mode transistor TrD are assembled. In the second embodiment of FIG. 6, the data output lines B1 to B4 each have a larger stray capacitance than each of the array subunits $11_1$ to $11_4$. Therefore, the data output lines B1 to B4 are discharged during a longer period of time than those of the first embodiment of FIG. 3. However, the application of the P-channel MOS transistors Tp1 to Tp4 as data output line selection MOS transistors shortens the access time $t_{ac}$.

In the first and second embodiments of FIGS. 3 and 6, one P-channel MOS transistor was connected between each of the data output lines B1 to B4 and data output node W1. However, the effect of this invention can be attained even by connecting in series the source-drain paths of respective groups of two P-channel MOS transistors Tp5-Tp6, Tp7-Tp8, Tp9-Tp10, and Tp11-Tp12 between each of the aforesaid data output lines B1 to B4 and the data output node W1. In such a case, it is possible to omit the row decoder 4 and connect the driving lines R1, R1, R2, R2 as shown in FIG. 6.

When this invention is applied to a decoder, it is advisable to omit the column decoder 3 and row decoder 4 used in the foregoing first and second embodiments, and supply input data having a logic level "1" or "0" to the selection signal input lines C11 to C1n and further supply driving signals having a logic level "1" or "0" to the driving lines R1 to R4.

What is claimed is:

1. A data readout circuit for an MOS transistor array comprising:
    an MOS transistor array including a plurality of first MOS transistors in a matrix of row and column groups;
    a plurality of data output lines, each of which is connected to one end of the current path of each of said first MOS transistors of a corresponding row group;
    a plurality of selection signal input lines, each of which is connected to the gate electrodes of the first MOS transistors of a corresponding column group of MOS transistors;
    a column decoder for sending first control signals to said selection signal input lines;
    a data output node coupled to the other end of each of said MOS transistors current paths;
    a plurality of second MOS transistors for effecting selective connections between said plurality of data output lines and said data output node;
    a plurality of driving lines for selectively driving said second MOS transistors;
    a row decoder which sends second control signals to said driving lines;
    a precharge voltage source;
    means for precharging and discharging said data output lines and said data output node in accordance with said first and second control signals, said precharging and discharging means including a plurality of third MOS transistors each connected between a corresponding one of said data output lines and said precharge voltage source; and
    means for obtaining readout data in accordance with the potential level on said data output node,
    wherein said first MOS transistors have a first conductivity type and said second and third MOS transistors have a second conductivity type, said second MOS transistors being rendered conductive while both said data output node and said data output lines are in a precharged state.

2. A data readout circuit according to claim 1, wherein said first MOS transistors are N-channel MOS transistors and said second and third MOS transistors are P-channel MOS transistors.

3. A data readout circuit according to claim 1, wherein said selection signal input lines are supplied with output signals from said column decoder and said driving lines are supplied with output signals from said row decoder.

4. A data readout circuit according to claim 1, wherein said selection signal input lines include means for receiving data to be decoded.

* * * * *

UNITED STATES PATENT AND TRADEMARK OFFICE
CERTIFICATE OF CORRECTION

PATENT NO. : 4,592,021

DATED : May 27, 1986

INVENTOR(S) : Hiroaki Suzuki and itsuo Sasaki

It is certified that error appears in the above-identified patent and that said Letters Patent is hereby corrected as shown below:

On the title page assignee should read

-- (73) Assignee: Tokyo Shibaura Denki Kabushiki Kaisha --.

Signed and Sealed this

Second Day of September 1986

[SEAL]

Attest:

DONALD J. QUIGG

Attesting Officer

Commissioner of Patents and Trademarks